United States Patent
Sasaki et al.

(10) Patent No.: US 8,251,636 B2
(45) Date of Patent: Aug. 28, 2012

(54) LID CLOSING METHOD FOR CLOSED CONTAINER AND LID OPENING/CLOSING SYSTEM FOR CLOSED CONTAINER

(75) Inventors: Mutsuo Sasaki, Tokyo (JP); Toshihiko Miyajima, Tokyo (JP)

(73) Assignee: TDK Corporation, Tokyo (JP)

(*) Notice: Subject to any disclaimer, the term of this patent is extended or adjusted under 35 U.S.C. 154(b) by 325 days.

(21) Appl. No.: 12/627,369

(22) Filed: Nov. 30, 2009

(65) Prior Publication Data

US 2010/0135755 A1    Jun. 3, 2010

(30) Foreign Application Priority Data

Nov. 28, 2008  (JP) ................................. 2008-304423
Nov. 27, 2009  (JP) ................................. 2009-269441

(51) Int. Cl.
*B65G 65/34* (2006.01)
(52) U.S. Cl. ........................ 414/810; 414/411
(58) Field of Classification Search .................. 414/217, 414/411, 806, 810
See application file for complete search history.

(56) References Cited

U.S. PATENT DOCUMENTS

| | | | |
|---|---|---|---|
| 6,186,723 B1 | 2/2001 | Murata et al. | |
| 6,984,097 B1 | 1/2006 | Saeki et al. | |
| 7,021,882 B2 * | 4/2006 | Otaguro | 414/217.1 |
| 7,102,124 B2 * | 9/2006 | Bacchi et al. | 250/239 |
| 7,344,349 B2 * | 3/2008 | Nagata | 414/411 |
| 7,484,333 B2 * | 2/2009 | Houser et al. | 49/506 |
| 2008/0008570 A1 * | 1/2008 | Rogers et al. | 414/292 |
| 2010/0028111 A1 * | 2/2010 | Krolak et al. | 414/411 |

FOREIGN PATENT DOCUMENTS

| | | |
|---|---|---|
| JP | 11-288991 | 10/1999 |
| JP | 2001-77177 | 3/2001 |

* cited by examiner

*Primary Examiner* — Charles A Fox
(74) *Attorney, Agent, or Firm* — Oblon, Spivak, McClelland, Maier & Neustadt, L.L.P.

(57) ABSTRACT

Provided is a method of detecting whether or not a lid is fixed to a pod appropriately when performing an operation of closing an opening of the pod by the lid in an FIMS system. Determination is made whether or not a door is present at a predetermined position when the lid is attached to the pod and whether or not the pod is displaced from a position of opening/closing the lid, and determination is made again, after the lid engages with the pod, whether or not the door is present at the predetermined position and whether or not the pod is displaced from the position of opening/closing the lid. When it is confirmed in both the determinations that the door is present at the predetermined position and the pod is not displaced, determination that fixation of the lid is appropriate is made.

8 Claims, 11 Drawing Sheets

LID CLOSING METHOD FOR CLOSED CONTAINER AND LID OPENING/CLOSING SYSTEM FOR CLOSED CONTAINER

This application claims the priority of Japanese Patent Application Nos. 2008-304423 filed on Nov. 28, 2008 and 2009-269441 filed on Nov. 27, 2009, which are hereby incorporated by reference herein.

BACKGROUND OF THE INVENTION

1. Field of the Invention

The present invention relates to what is called a front-opening interface mechanical standard (FIMS) system that is used to transfer wafers stored in an interior of a transfer container called a pod between semiconductor processing apparatuses in a semiconductor manufacturing process, etc. More specifically, the present invention relates to a pod called a front-opening unified pod (FOUP) or a closed container for storing wafers and a method of fixedly attaching a lid to such a pod from which the lid has been detached to close an opening of the pod in an FIMS system for opening/closing the lid of the pod to allow transfer of wafers into/out of the pod. The present invention also relates to a lid opening/closing system that preferably carries out the method.

2. Description of the Related Art

Conventionally, the semiconductor manufacturing

Conventionally, the semiconductor manufacturing process had been performed in what is called a clean room that is constructed by establishing a high degree of cleanliness in the room in which semiconductor wafers are handled. In recent years, however, in view of an increase in the wafer size and with a view to reduce cost incurred in maintenance of the clean room, there has been adopted a method of keeping highly clean only an interior of a processing apparatus, a pod (container for storing wafers), and a mini-environment through which substrates are transferred between the pod and the processing apparatus.

The pod includes a substantially cubical main body (closed container) which has shelves provided therein so as to be capable of holding a plurality of wafers in a parallel and separated state and an opening provided on one of the sides or external walls thereof through which wafers can be transferred into/out of the pod, and a lid for closing the opening. The pods as described above which have an opening provided not on the bottom but on one lateral side thereof (i.e. side to be just opposed to the mini-environment) are collectively called front-opening unified pods (FOUPs). The present invention mainly pertains to technologies that use the FOUP.

A structure that defines the above-mentioned mini-environment includes a first opening portion to be opposed to the opening of the pod, a door that closes the first opening portion, another processing apparatus side opening portion provided on the semiconductor processing apparatus side, and a transferring robot that is adapted to enter the interior of the pod through the first opening portion to hold a wafer and transfer the wafer into the processing apparatus through the another processing apparatus side opening portion. The structure that defines the mini-environment further has a support table for supporting the pod such that the opening portion of the pod is placed just in front of the door.

On the top surface of the support table, there are provided positioning pins to be fitted into positioning holes provided on the bottom surface of the pod to regulate the placement position of the pod and a clamp unit for engaging a clamped portion provided on the bottom surface of the pod to fix the pod onto the support table. Typically, the support table is adapted to be movable toward and away from the door over a predetermined distance. When wafers in the pod are to be transferred into the processing apparatus, the pod placed on the support table is moved until the lid of the pod comes into contact with the door, and then after contact, the lid is detached from the opening portion of the pod by the door (see Japanese Patent Application Laid-Open No. 11-288991). By those operations, the interior of the pod and the interior of the processing apparatus are bought into communication with each other through the mini-environment. After that, wafer transferring operations are allowed to be performed repeatedly. All of the support table, the door, the first opening portion, a mechanism for opening/closing the door, a wall partially defining the mini-environment and having the first opening portion, and other components collectively constitute what is called a front-opening interface mechanical standard (FIMS) system.

As disclosed in detail in Japanese Patent Application Laid-Open No. 2001-077177, a lid of a conventional pod is provided with an engagement tongue that is extendable/retractable outwardly beyond/into the outer periphery of the lid, and a receiving hole with which the engagement tongue engages is provided at a position in the pod corresponding the engagement tongue. The engagement tongue and the receiving hole function as an engagement means for fixedly attaching the lid to the pod. In a conventional structure, the pod and the lid are brought into an engagement state and a disengaged state by extension and retraction of the tongue. When, for example, the opening of the pod is closed by the lid, the tongue provided on the lid may sometimes fail to be inserted precisely into the receiving hole on the pod due to the presence of a foreign matter(s) between the opening and the lid or a positional displacement resulting from accumulation of errors such as a positional error of the pod on the support table and an operation error of the door etc. In such cases, if it is mistakenly determined that the opening of the pod is completely closed by the lid, subsequent operations such as transportation of the pod are performed, and there is a fear in that the lid is dislocated or detached from the pod, for example, during transportation of the pod. A countermeasure to the above-mentioned situation that has been under development currently is to arrange a sensor that detects the state of the tongue to detect displacement of the tongue from a normal position, thereby reliably determining whether or not the opening is closed successfully, as disclosed in Japanese Patent Application Laid-Open No. 2001-077177.

In pods having a conventional size, there is not much risk of occurrence of a failure in closing by the lid by virtue of the relationship among the sizes of the lid, the receiving hole on the pod, and the projecting portion of the tongue. In addition, the operation of the tongue can be detected relatively easily, and it is possible to determine whether the closing is successful or not by detecting abnormality in a mechanism that operates the tongue. However, an increase in the size of the pod with an increase in the wafer diameter in recent years necessitates a decrease in the size of the engagement portion of the tongue relative to the size of the pod, relatively. For this reason, the risk of occurrence of a failure in closing may increase, or there may be cases where an operation error of the tongue cannot be detected even when a failure in closing occurs. In addition, pods that are currently used are not provided with such a mechanism for detecting the tongue. When an attempt is made to actually provide this method, it is necessary to replace or modify all the pods. Further, it may be sometimes difficult to provide the above-mentioned mechanism depending on a shape, etc. of the pod.

SUMMARY OF THE INVENTION

The present invention has been made in view of the above-mentioned situation, and an object of the present invention is therefore to provide a lid closing method for a closed container of detecting whether steady engagement of the lid with the pod is achieved in the operation of attaching the lid to the pod to close the opening and enabling removal of the pod from the FIMS after the detection, and a lid opening/closing system for a closed container that is carried out by the lid closing method.

In order to achieve the above-mentioned object, according to the present invention, provided is a lid closing method, which is applied to a lid opening/closing system that opens and closes a lid of a closed container to allow transfer of an object to be stored into/out of an interior of the closed container, the closed container including the lid, having an opening to be closed by the lid on one lateral side thereof, and being capable of storing therein the object to be stored, the lid closing method being used for closing the opening by the lid, the lid and the closed container including an engagement means for fixedly attaching the lid to the closed container by an operation from outside one of the lid and the closed container, the lid opening/closing system including: a mini-environment having an opening portion; a door that is movable between a position at which the door nearly closes the opening portion and a position at which the door leaves the opening portion open, and includes a lid holding means for holding the lid; a docking plate on which the closed container is allowed to be placed in such a way that the opening is opposed to the opening portion, the docking plate being movable toward and away from the opening portion together with the closed container to arrange, when located at a position close to the opening portion, the closed container at a first position at which the lid is to be detached and the object to be stored is transferred into/out of the closed container, and to arrange, when located at a position away from the opening portion, the closed container at a second position at which loading and unloading of the closed container is to be performed; and a docking plate driving means for causing the docking plate to move toward and away from the opening portion, the lid closing method including: moving the lid to the position at which the door nearly closes the opening portion; determining presence of the door at the position at which the door nearly closes the opening portion and presence of the docking plate at the first position; fixedly attaching the lid to the closed container by the engagement means; and determining the presence of the door at the position at which the door nearly closes the opening portion and the presence of the docking plate at the first position.

In the above-mentioned lid closing method, it is preferred that the docking plate driving means include a cylinder mechanism, and that a drive force for driving the docking plate by the docking plate driving means be set smaller than a drive force exerted when the door is moved to nearly close the opening portion. Further, it is preferred that the door be swingably supported by a door arm for supporting the door at one end thereof, a door open/close actuator coupled to another end of the door arm to drive the door arm, and a rotation center for rotatably and pivotally supporting the door arm between the door and the door open/close actuator, and that determination whether or not the door is present at the position at which the door nearly closes the opening portion be made based on a signal that is obtained from a door-position detecting sensor arranged between the rotation center in the door arm and the door. In addition, it is preferred that the door-position detecting sensor include: a door recessed portion formed in a front surface of the door arm that is opposed to a surface of a chassis having the opening portion formed therein, the chassis defining the mini-environment; a movable dog which is received in the door recessed portion and has a tip end projecting from the front surface of the door arm; a biasing means received in the door recessed portion, for imparting a biasing force in a projecting direction to the movable dog; and a movable-dog-position detecting sensor for outputting a signal corresponding to a projecting amount from the front surface of the door arm of the movable dog according to a position at which the movable dog stops. Alternatively, it is preferred that the door-position detecting sensor include: a door sensor dog that projects from the door arm; and a photo sensor which is provided on a chassis defining the mini-environment, and is arranged in a sensor recessed space constituting a recessed portion that allows entrance of the door sensor dog thereinto, the door-position detecting sensor outputting a signal while the signal is switched between two modes according to the entrance of the door sensor dog into the sensor recessed space.

Further, in order to achieve the above-mentioned object, according to the present invention, provided is a lid opening/closing system that opens and closes a lid of a closed container to allow transfer of an object to be stored into/out of an interior of the closed container, the closed container including the lid, having an opening to be closed by the lid on one lateral side thereof, and being capable of storing therein the object to be stored, the lid and the closed container including an engagement means for fixedly attaching the lid to the closed container by an operation from outside one of the lid and the closed container, the lid opening/closing system including: a mini-environment having a first opening portion; a door that is movable between a position at which the door nearly closes the opening portion and a position at which the door leaves the opening portion open, and includes a lid holding means for holding the lid; a docking plate on which the closed container is allowed to be placed in such a way that the opening is opposed to the opening portion, the docking plate being movable toward and away from the opening portion together with the closed container to arrange, when located at a position close to the opening portion, the closed container at a position at which the lid is to be detached and the object to be stored is transferred into/out of the closed container, and to arrange, when located at a position away from the opening portion, the closed container at a position at which loading and unloading of the closed container is to be performed; a docking plate driving means for causing the docking plate to move toward and away from the opening portion; a displacement detecting means for detecting that the docking plate is displaced from the position close to the opening portion; and a door-position detecting sensor for outputting a signal according to presence of the door at the position at which the door nearly closes the opening portion.

Note that, in the above-mentioned lid opening/closing system, it is preferred that the docking plate driving means include a cylinder mechanism, and that a drive force for driving the docking plate by the docking plate driving means be set smaller than a drive force exerted when the door is moved to nearly close the opening portion.

According to the present invention, it is possible to reliably detect whether or not a tongue of the lid engages with a main body of a pod irrespective of the size of the pod and the like. Therefore, for example, a risk of dislocation of the lid during pod transportation can be eliminated, and the pod transportation speed can be increased. Thus, the variety of options in the operation condition of the pod transportation system or the variety of options in the transportation system itself can be increased. Further, basically, it is unnecessary to provide a special mechanism on the pod, and hence a conventional pod or the like can be used as it is. For that reason, no additional cost is imposed on a user of the system. Further, according to the present invention, by adding a sensor for detecting a stop position of the door to a conventional apparatus, and by using signals obtained from the sensor, a dock sensor described below, etc., it is possible to perform simple detection of a fixation condition of the lid by correcting a flow on control. Therefore, without making significant change to a mechanical structure of the conventional apparatus, it is possible to carry out the present invention.

Further features of the present invention will become apparent from the following description of exemplary embodiments with reference to the attached drawings.

DESCRIPTION OF THE EMBODIMENTS

Figure 1:
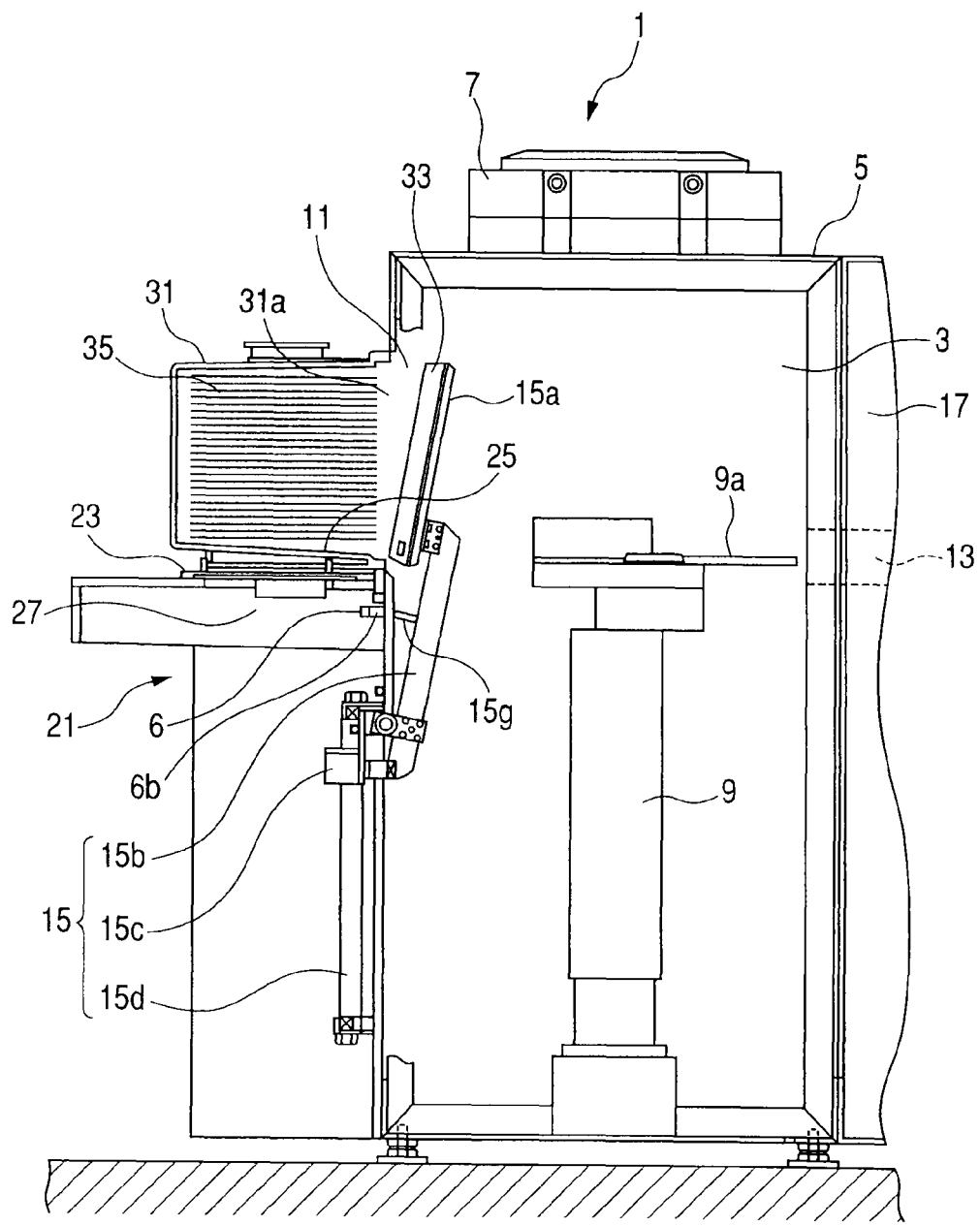
FIG. 1 is a side cross sectional view illustrating a general structure of a load port apparatus according to an embodiment of the present invention.
Figure 2:
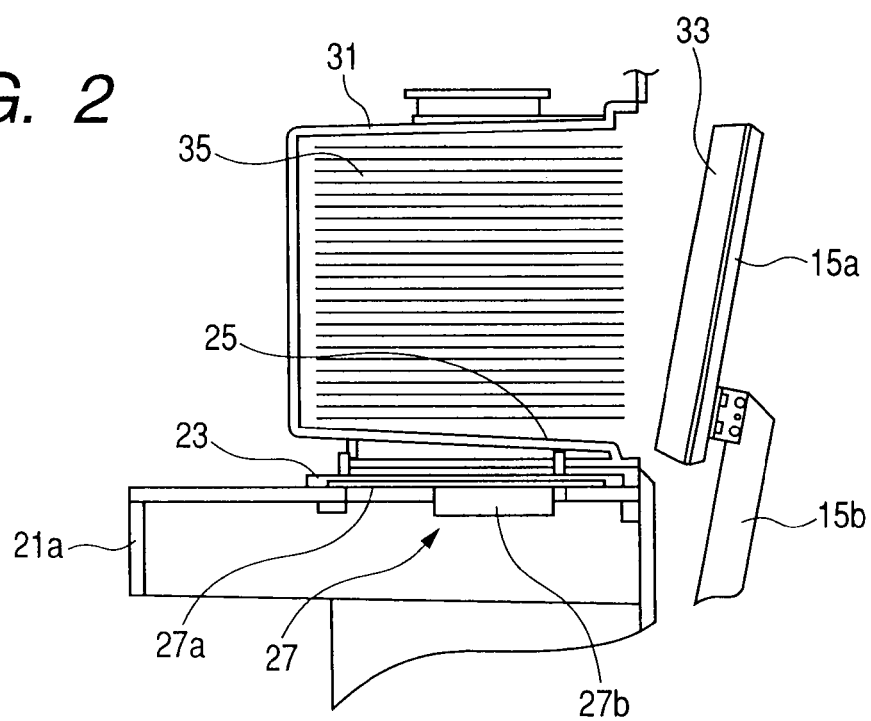
FIG. 2 is an enlarged side cross sectional view illustrating, in a manner similar to FIG. 1, a main portion of the general structure of the load port apparatus according to the embodiment of the present invention.
Figure 3:
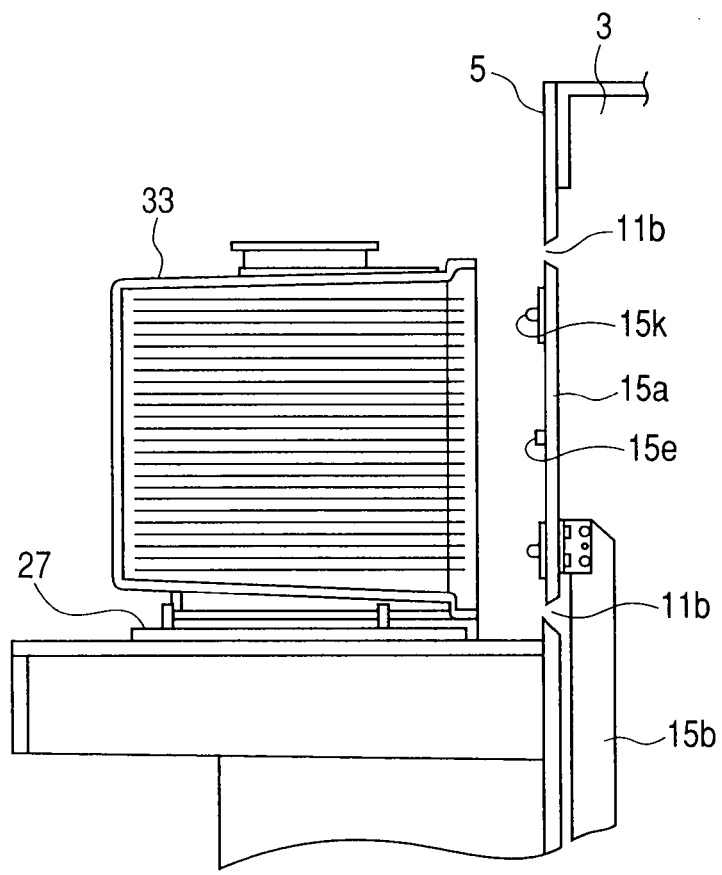
FIG. 3 is an enlarged schematic view illustrating components provided in vicinities of a door and a first opening portion in the load port apparatus illustrated in FIG. 1.
Figure 4A:
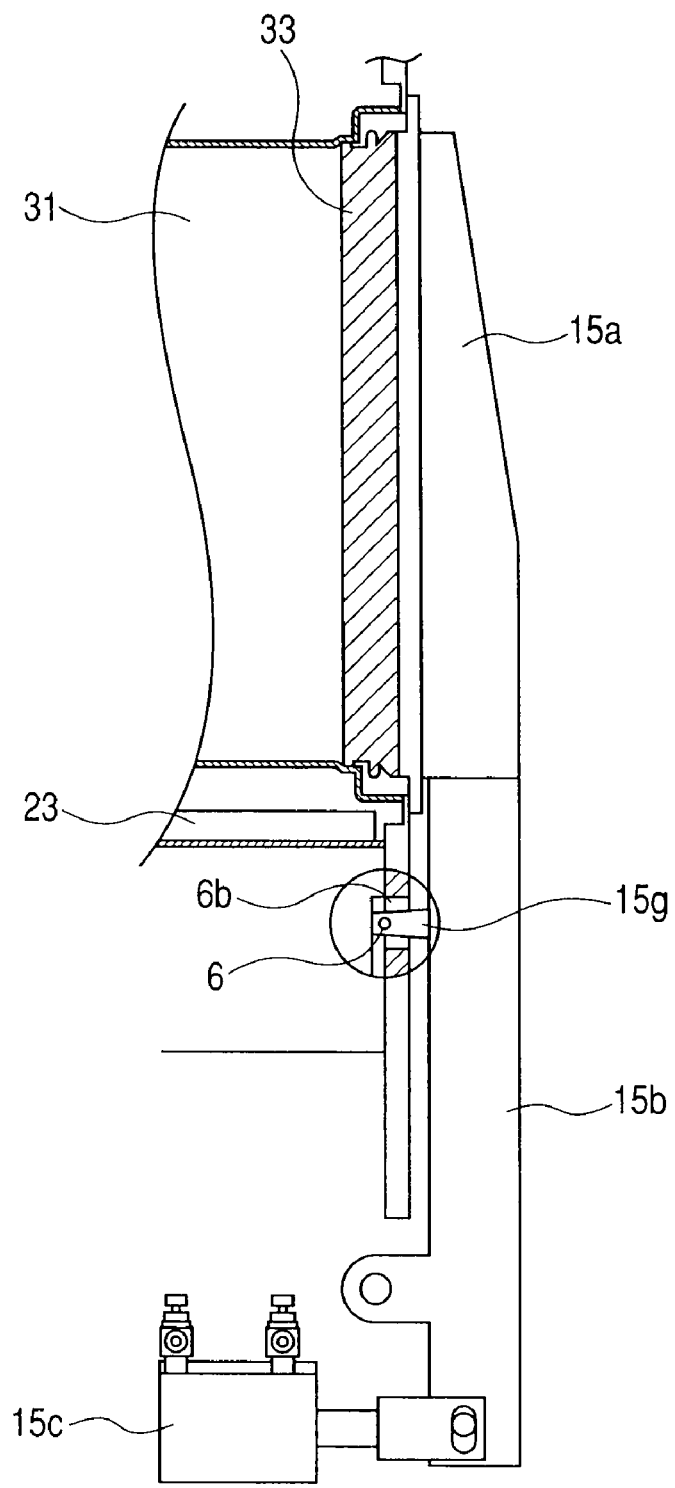
FIG. 4A is a view illustrating, while focusing on a door-position detecting sensor, a state in which a lid 33 is normally attached to a pod 31 in the structure illustrated in FIG. 1.
Figure 4B:
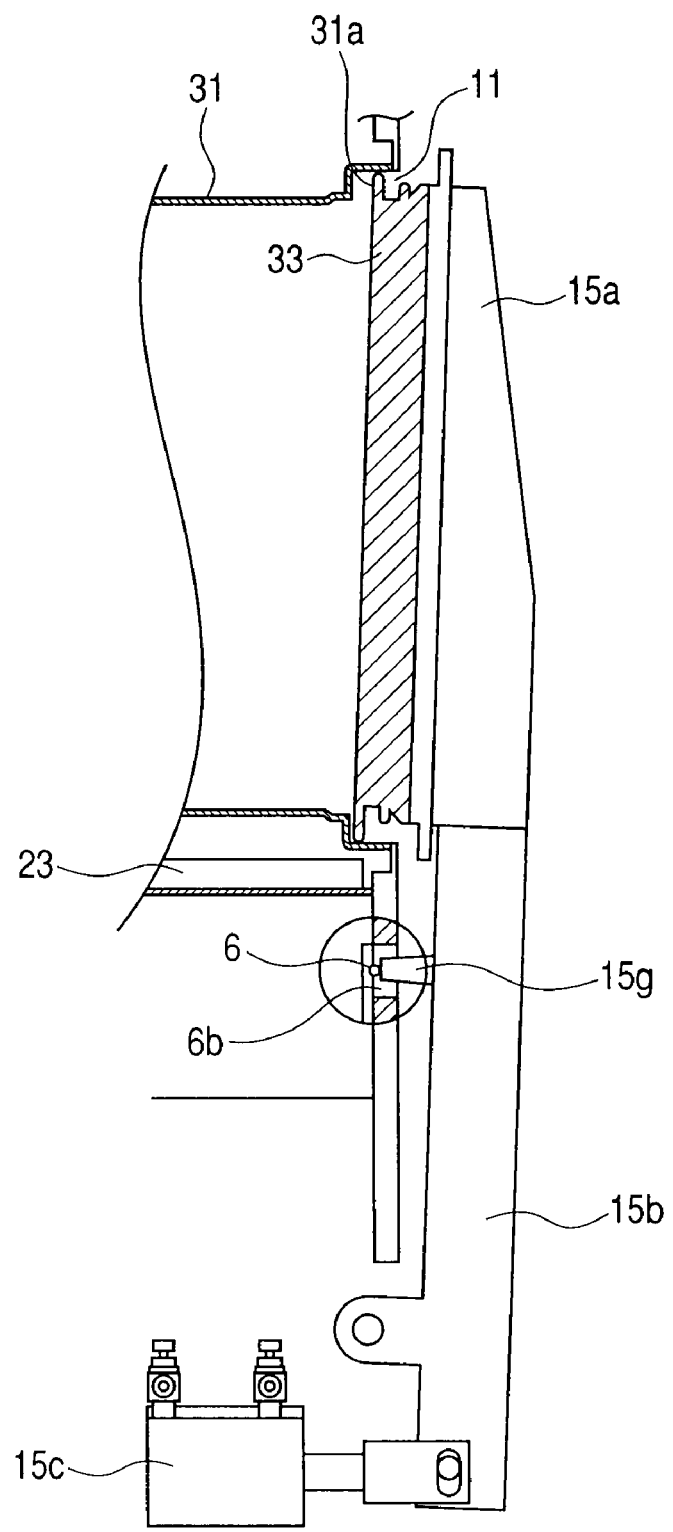
FIG. 4B is a view illustrating, in a manner similar to FIG. 4A, a state in which the lid 33 is not normally attached to the pod 31.
Figure 5A:
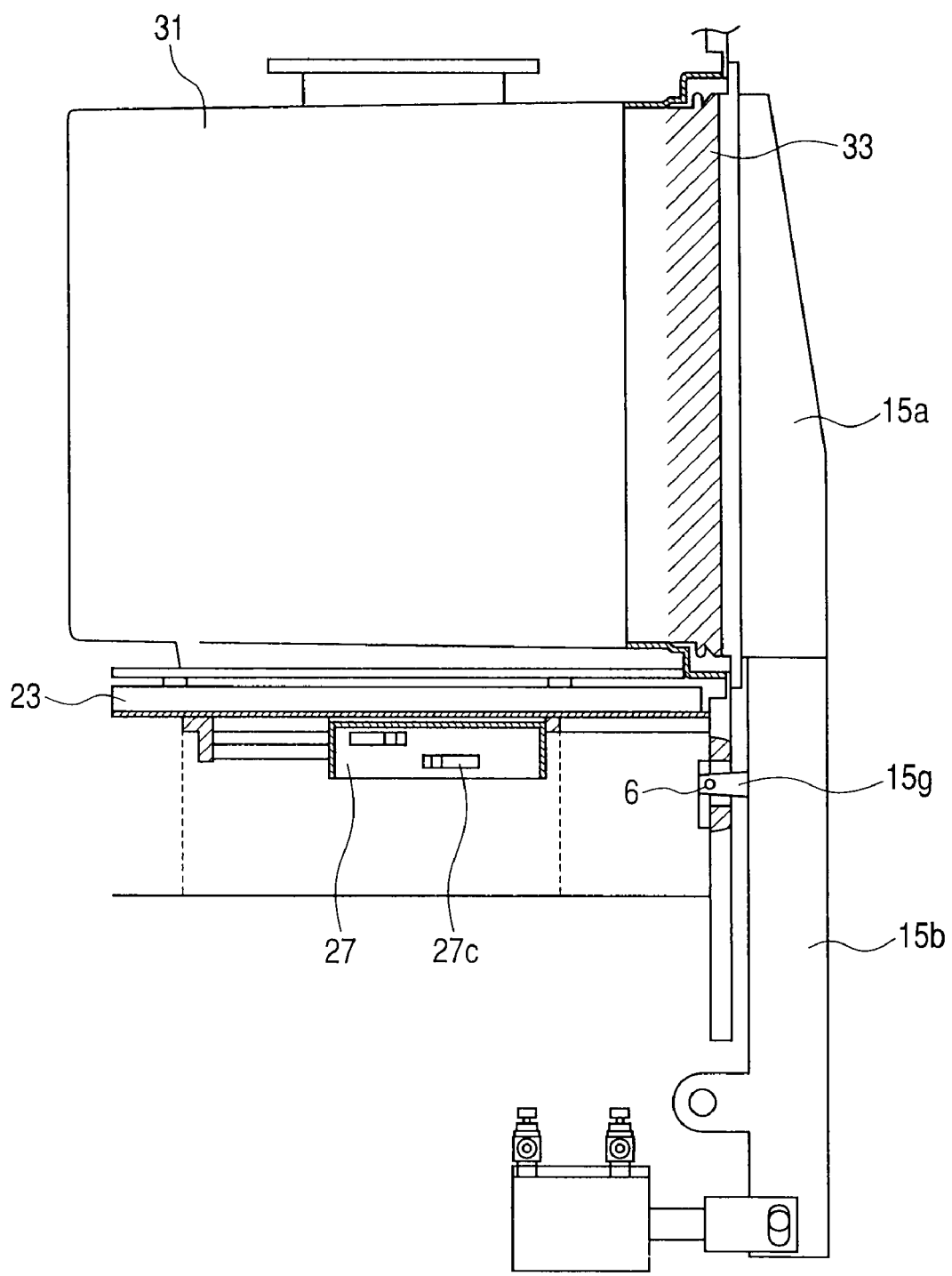
FIG. 5A is a view illustrating, while focusing on a dock sensor, the state in which the lid 33 is normally attached to the pod 31 in the structure illustrated in FIG. 1.
Figure 5B:
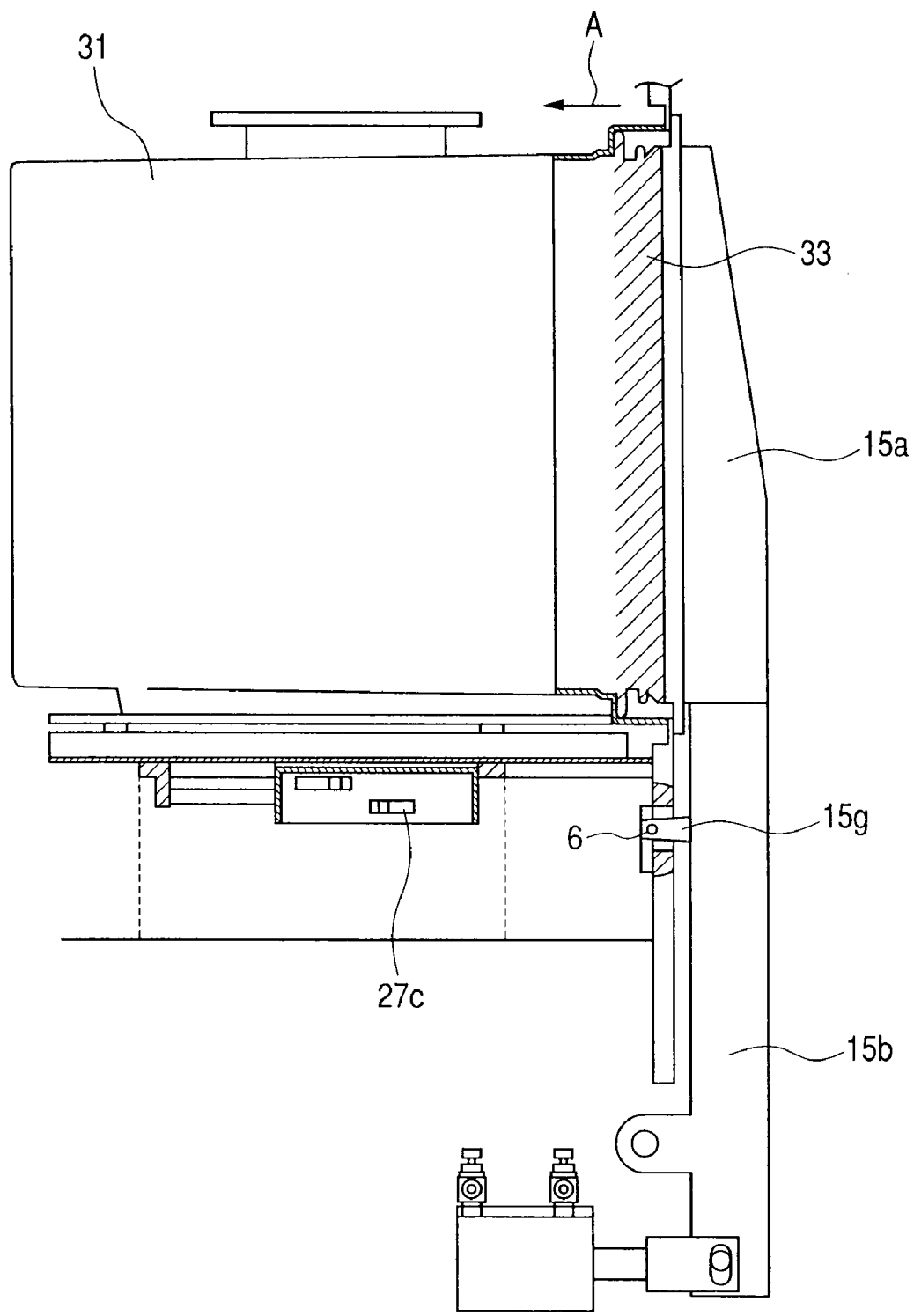
FIG. 5B is a view illustrating, in a manner similar to FIG. 5A, the state in which the lid 33 is not normally attached to the pod 31.

In the following, an embodiment of the present invention is described with reference to the drawings. FIG. 1 is a side cross sectional view illustrating a general structure of an FIMS system 1 according to the embodiment of the present invention. FIG. 2 is an enlarged view illustrating a pod support portion, a door, a pod, a lid, etc. of this system 1 in a manner similar to FIG. 1. Further, FIG. 3 is a schematic view illustrating the pod support portion, the door, etc. in a state in which an opening of the pod is closed by the lid. Further, FIG. 4A is an enlarged view of components provided in a vicinity of the door in the structure illustrated in FIG. 1, which illustrates a state in which the door closes the opening of the pod while the lid is in a normal state. FIG. 4B is a view illustrating a state in which the lid is pressed against the opening of the pod in the same structure as that of FIG. 4A while the lid is not in the normal state. FIG. 5A is a view illustrating the state illustrated in FIG. 4A such that components for illustration cover the pod and a docking plate drive system. Further, FIG. 5B is a view corresponding to FIG. 4B.

The FIMS system 1 includes a chassis 5 that defines a mini-environment 3 and a pod support portion 21 provided adjacent to the chassis 5. The chassis 5 is provided with a fan 7, a robot 9, a first opening portion 11, a second opening portion 13, and a door system 15. The fan 7 is provided on the chassis 5 in the upper portion of the mini-environment 3 to introduce air in a space outside the chassis 5 into the mini-environment. The bottom portion of the chassis 5 has a structure that allows the air to flow to the exterior. Thus, dust particles and the like generated in the mini-environment 3 are brought by the air flow and discharged to an exterior space from the bottom portion of the chassis 5. A robot arm 9a of the robot 9 can extend to the exterior of the mini-environment through the first opening portion 11 and the second opening portion 13. While the first opening portion 11 is closed, in a way, by a door 15a of the door system 15, a gap is left between the outer periphery of the door 15a and the inner peripheral surface of the first opening portion 11. Thus, the door 15a can nearly close the first opening portion 11. Further, as described below, at a position at which the door nearly closes the first opening portion, the door 15a performs an operation of sucking and holding a lid fixedly attached to a pod 31, or an operation of attaching the lid 33 to a predetermined position of the pod 31. The second opening portion 13 leads to an interior of a wafer processing apparatus 17. The detailed description of the wafer processing apparatus 17 is omitted in this specification, because the wafer processing apparatus 17 has no direct bearing on the present invention. Further, the second opening portion 13 does not exert special effects as features of the present invention, and hence the "opening portion" referred in the present invention represents the first opening portion 11.

The pod support portion 21 includes a docking plate 23, a pod fixation system 25, and a docking plate drive system 27. The upper surface of the docking plate 23 is substantially flat, and some portions of the pod fixation system 25 are provided on the upper surface thereof. The pod 31 described in "BACKGROUND OF THE INVENTION" section is placed on the upper surface of the docking plate 23, and the above-mentioned portions (specifically, in the form of pins) of the pod fixation system 25 engage with engaged portions (not shown) provided on the bottom surface of the pod 31. Thus, the pod 31 is fixed at a predetermined position on the docking plate 23. Note that, the docking plate 23 is provided such that an opening 31a of the pod 31 is just opposed to the above-mentioned first opening portion 11 when the pod 31 is placed on the upper surface of the docking plate 23. The docking plate drive system 27 drives the docking plate 23 and the pod 31 fixed at the predetermined position thereon toward and away from the first opening portion 11 by using a guide rail 27a and a drive cylinder 27b. That is, the docking plate drive system 27 serving as a docking plate driving means can move the pod 31 toward and away from the first opening portion 11. Further, the docking plate drive system 27 arranges, when located at a position close to the opening portion, the pod 31 at a first position at which the lid 33 is to be detached and a wafer is transferred into/out of the pod, and arranges, when located at a position away from the opening portion, the pod 31 at a second position at which loading and unloading of the pod 31 is to be performed. One end of the drive cylinder 27b is fixed to a support table body 21a, and the other end or an end of an extendable/retractable cylinder is fixed to the docking plate 23. The docking plate 23 is slidably supported on the guide rail 27a so that the docking plate 23 can slide on the guide rail 27a with extension/retraction of the cylinder end of the drive cylinder 27b.

In a region which is located below the first opening portion 11 of the chassis 5 and in which the chassis 5 is coupled to the pod support portion 21, there is provided a photo sensor 6 for detecting the position of the door 15a in association with a door sensor dog 15g described below. The photo sensor 6 is arranged in a sensor recessed space 6b which is formed in the chassis 5 so as to be capable of receiving the door sensor dog 15g projecting from a door arm 15b. The sensor recessed space 6b is formed by drilling a wall surface on the mini-environment side of the chassis 5 toward a wall surface side on which the pod support portion 21 is provided, and the photo sensor 6 is arranged such that sensor light crosses a forming direction of the sensor recessed space 6b. In this case, it is preferred that the photo sensor 6 be arranged on the pod support portion 21 side (on a deep portion of the space). At a stage at which the door sensor dog 15g enters the sensor recessed space 6b to some extent or more, the photo sensor 6 outputs an ON signal indicating that the door 15a is to perform the operation of attaching the lid 33 to the pod 31. At a stage at which the door sensor dog 15g further enters the sensor recessed space 6b and the lid 33 reaches a position of completely closing the opening 31a of the pod 31, the photo sensor 6 outputs an OFF signal. Thus, even with such a simple structure including a pair of members of the photo sensor and the sensor dog, it is possible to reliably detect the state of the lid 33 by monitoring the change in a series of signals. Note that, in this embodiment, the structure including the photo sensor 6 and the door sensor dog 15g is used as a door-position detecting sensor. However, the door-position detecting sensor is not limited to this combination. For example, there may be adopted a variety of well-known combinations such as a combination of a contact sensor and a sensor pressing pin. Further, there may be adopted a structure in which the ON signal is output only when the door finally stops.

As illustrated in FIG. 3, on the exterior space side surface of the door 15a (surface opposed to the pod 31), a latch system (mechanism) 15e is provided. The latch system 15e engages with a portion to be latched (not shown) provided on the front surface of the lid 33 of the pod 31, to thereby rotate. As a result, the latch system 15e causes an engagement tongue connected to the portion to be latched to retract from a receiving hole formed in the pod 31, or causes the engagement tongue in a disengaged state to enter the receiving hole. Thus, the lid 33 can be attached to or detached from the pod 31. Suction pads 15k are supplied with a negative pressure from a negative pressure supplying (providing) source 8 (see FIG. 6) through pipes (not shown) when the suction pads 15k are in contact with the lid 33, and thus the lid 33 is sucked by the suction pads 15k. Accordingly, the lid 33 can be held by the door 15a. The door system 15 includes the door arm 15b, a door open/close actuator 15c, and a door up/down system 15d. The door arm 15b is a rod-like member. The door arm 15b supports the door 15a at one end thereof and is coupled to the door open/close actuator 15c at the other end thereof. The door arm 15b is pivotally supported by a pivot shaft at an appropriate intermediate position so as to be swingable about that position. The door arm 15b is swung about the rotation center axis by the door open/close actuator 15c, and thus one end of the door arm 15b and the door 15a supported thereon are moved toward or away from the first opening portion 11. The door up/down system 15d supports the door open/close actuator 15c and the pivot shaft of the door arm 15b, and has a vertical movement actuator to move the door open/close actuator, and the door arm 15b and the door 15a which are supported thereby in a vertical direction along a guide extending in the vertical direction.

Further, the door arm 15b is provided with the above-mentioned door sensor dog 15g which is arranged so as to be opposed to the chassis 5 and correspond to the sensor recessed space 6b. The door sensor dog 15g projects perpendicularly to an extending surface of the door arm 15b (surface of the door 15a for closing the first opening portion 11). More specifically, the door sensor dog 15g is arranged between the rotation center of the door arm 15b and the door 15a. As described above, the door open/close actuator 15c and the door-position detecting sensor are separated from each other, and hence it is possible to achieve precise detection of a slight inclination, displacement, etc. of the door 15a, the precise detection being difficult to be achieved by a conventional method. Further, typically, regarding a component that repeatedly moves such as the door arm 15b, there is a fear in that the component is displaced from its reference position due to influences of deterioration with age of a member such as a bearing. As in a case of this embodiment, by arranging only the door sensor dog 15g on the door arm 15b, and by arranging the photo sensor 6 used for actual detection on the chassis 5 serving as a stationary component, it is possible to obtain the door-position detecting sensor which allows easy correction and can stably detect the displacement.

Figure 6:
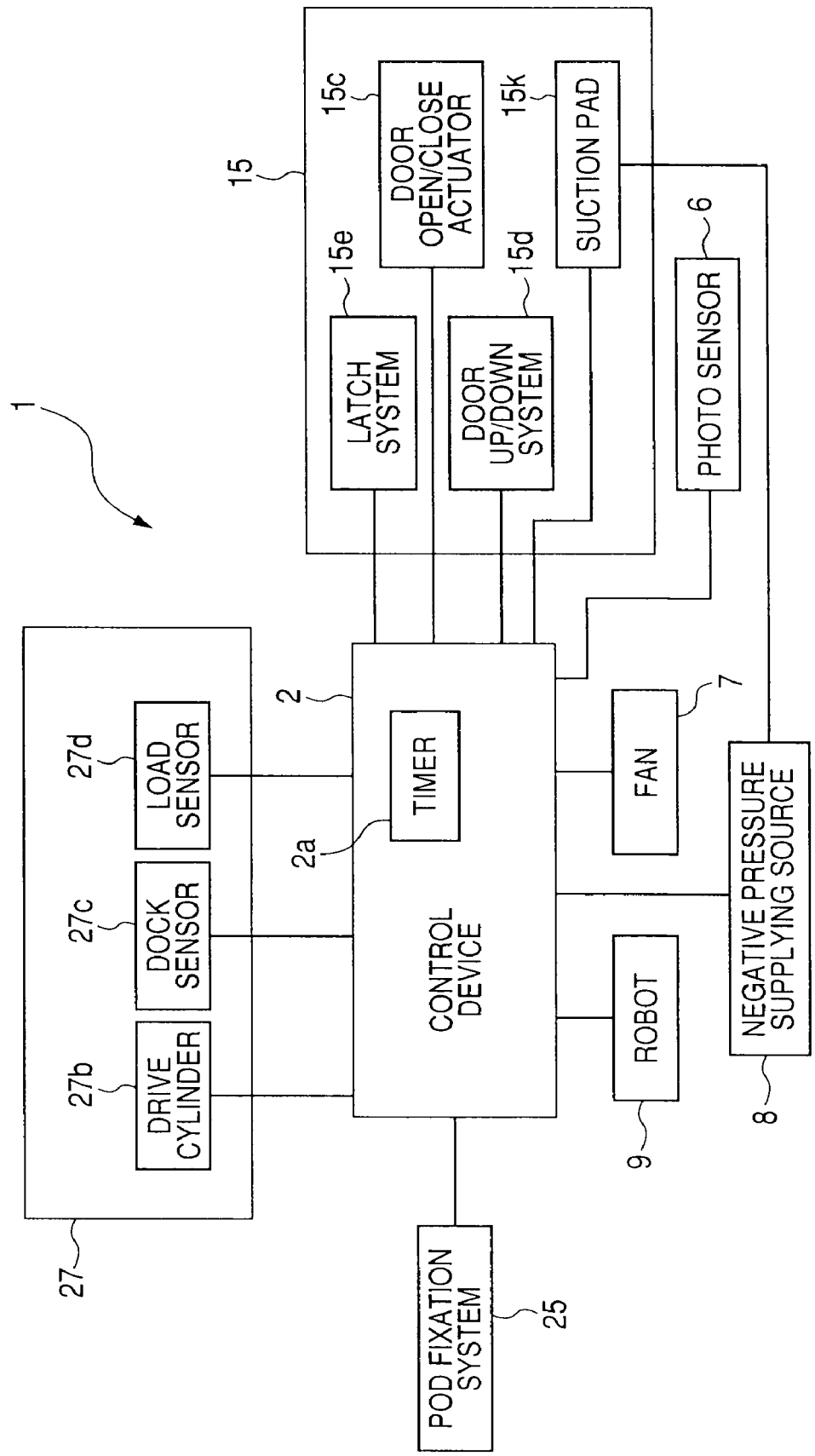
FIG. 6 is a block diagram illustrating a general configuration of an FIMS system according to the embodiment of the present invention.

Note that, FIG. 6 is a block diagram illustrating a configuration of the FIMS system 1. The above-mentioned fan 7, robot 9, door system 15, pod fixation system 25, and docking plate drive system 27 are controlled by a control device 2. The latch system 15e, the door open/close actuator 15c, and the door up/down system 15d in the door system 15 may be controlled independently from each other. However, in the actual operation, they are controlled so as to operate according to a sequence time chart. The suction pads 15k function as a lid holding means for holding the lid 33 by vacuum suction. Note that, provision of the negative pressure to the suction pads 15k from the negative pressure supplying source 8 and shutting-off of the provision thereof (breaking of the negative pressure) are controlled by the control device 2. The docking plate drive system 27 turns on and off the driving of the drive cylinder 27b. It is necessary to detect, with reliability, two predetermined positions of the docking plate 23 driven by the operation of the drive cylinder 27, that is, a load position that allows placement of the pod 31 and a dock position that allows transfer of wafers from/into the pod 31. For this purpose, connected to the docking plate drive system 27 is a load sensor 27d that detects placement of the pod 31 on the docking plate 23 and presence of the docking plate 23 at the position allowing loading and unloading of the pod 31 with respect to the docking plate 23. In addition, also connected to the docking plate drive system 27 is a dock sensor 27c that detects whether or not the docking plate 23 is present at the dock position (position at which the pod 31 is moved closest to the first opening portion 11 and wafers 35 stored in the pod 31 are transferred from/into the pod 31). The dock sensor 27c is constituted by a contact sensor, and outputs the OFF signal to transmit the same to the control device 2 even when the forward end of the docking plate 23 is slightly displaced from its reference position. That is, the dock sensor 27c outputs the signal according to the displacement of the forward end of the docking plate 23 from the reference position, and functions as a displacement detecting means in association with the control device 2.

Next, with reference to FIGS. 4A, 4B, 5A, and 5B, there is described how the above-mentioned photo sensor 6 and the dock sensor 27c operate when the lid 33 is attached to the pod 31. As illustrated in FIG. 4A, in a normal operation of attaching the lid 33 to the pod 31, the lid 33 fits into a receiving recess for the lid 33 which is formed in the pod 31, and each of the door 15a and the door arm 15b supporting the door 15a takes a predetermined posture to close the first opening portion 11. In this case, the door sensor dog 15g enters the sensor recessed space 6b by a predetermined depth, and the photo sensor 6 transmits a sequence of OFF-ON-OFF signals to the control device 2 at predetermined timing. In contrast, as illustrated in FIG. 4B, the lid 33 may be sometimes pushed into the receiving recess of the pod 31 while being inclined due to a failure to fixedly attach the pod 31 or to hold the lid 33 by the door 15a, abnormality of operation of the door 15a, etc. In this case, even when the latch system 15e is operated in this state, the engagement tongue does not appropriately engage with the receiving hole, with the result that the lid 33 may fall down at the time of transportation of the pod. When the lid 33 is attached in this state, the door sensor dog 15g can not enter the sensor recessed space 6b by the predetermined depth. Therefore, the photo sensor 6 can not output the last OFF signal in the sequence of OFF-ON-OFF signals at the predetermined timing, or the photo sensor 6 outputs signals different from the normal signals (for example, signals having timing different from that of the normal signals). By comparing such signals with the normal signals in the control device 2, it is possible to detect the attached state of the lid 33 with respect to the pod 31.

Further, in a case where the lid 33 is to be attached to the pod 31 while being inclined, when, for example, a pressing force of the door 15a against the lid 33 is large, there is a fear in that the lid 33 undergoes deformation such as deflection. In this case, the photo sensor 6 only outputs the signal indicating that the lid 33 is normally attached to the pod 31. In this embodiment, in order to cope with the circumstance as described above, the following structure is added. That is, a drive source for exerting a drive force in the docking plate drive system 27 is constituted by an air cylinder or the like, and the drive force is set smaller than the above-mentioned pressing force of the door 15a.

When the door 15a and the lid 33 are maintained in a predetermined state, basically, the pressing force of the door 15a does not act on the pod 31, the docking plate 23, etc. However, when the door 15a presses the lid 33 in an inclined state, the pressing force, which acts on the lid 33 according to an extent of displacement when the lid is inclined, is applied to the pod 31, etc. The pressing force acts on the docking plate 23, and pushes and returns the docking plate 23 in a direction from the forward end toward the rear end thereof (toward a load position at which the pod 31 is placed on the pod support portion 21, or an unload position at which the pod 31 is brought away from the pod support portion 21). In the above-mentioned configuration, the dock sensor 27c transmits, to the control device 2, the OFF signal based on this positional change. FIG. 5A illustrates a state in which the lid 33 is appropriately attached to the pod 31, and FIG. 5B schematically illustrates a state in which the lid 33 is not appropriately attached to the pod 31 because the lid 33 is inclined. In a case illustrated in FIG. 5B, the pressing force indicated by an arrow A acts on the pod 31, and the dock sensor 27c outputs the OFF signal due to the pressing force. That is, by comparing both the signals of the photo sensor 6 and the signals of the dock sensor 27c with the signals output by the photo sensor 6 and the dock sensor 27c when the lid 33 is normally inserted in the pod 31, it is possible to reliably detect the attached state of the lid 33 with respect to the pod 31. Note that, the pressing force indicated by the arrow A corresponds to the drive force exerted when the door 15a moves for closing the first opening portion 11, and the pressing force can act on the lid 33, etc. by the time the door 15a nearly closes the first opening portion 11 and stops.

Here, the operation of the FIMS system 1 in actual wafer processing operations is described. In wafer processing operations, the pod 31 containing the predetermined number of wafers and filled with clean air is placed on the docking plate 23. When the pod 31 is placed on the docking plate 23, the pod fixation system 25 operates to achieve the predetermined placed position of the pod 31 on the docking plate 23. Thereafter, the docking plate drive system 27 operates to move the pod 31 toward the first opening portion 11. Specifically, the pod 31 that is made integral with the docking plate 23 by the pod fixation system 25 is moved by driving the docking plate 23 by the drive cylinder 27b. During this operation, the door 15a is kept stationary at the position at which the door 15a nearly closes the first opening portion 11. The driving operation is completed when the lid 33 of the pod 31 is brought into contact with a contact surface of the door 15a, and a predetermined positional relationship between the docking plate 23 and the first opening portion 11 is achieved. At this time, the latch system 15e engages with the portion to be latched on the front surface of the lid 33 to rotate, and thus the lid 33 can be attached to or detached from the pod 31. Simultaneously, the suction pads 15k suck the lid 33, and the lid 33 is held by the door 15a.

In this state, the door open/close actuator 15c starts to operate. Thus, the door arm 15b swings to move the door 15a that holds the lid 33 from the first opening portion 11 to the interior of the mini-environment 3. When the door arm 15b stops at a predetermined swing angle, the door up/down system 15d starts to operate, and thus the door 15a is moved downward together with the door open/close actuator 15c. By this operation, the first opening portion 11 is fully opened, and the mini-environment 3 is in communication with the interior of the pod 31 through the first opening portion 11. In this state, the robot 9 starts to operate, and transfers the wafers 35 from the interior of the pod 31 to the wafer processing apparatus 17 through the second opening portion 13, using the robot arm 9a. Further, while this state is maintained, the robot 9 also transfers, into the interior of the pod 31, wafers that have undergone a certain processing in the interior of the wafer processing apparatus 17. Basically, by reversing the above-mentioned procedure, the lid 33 is attached to the pod 31, and the pod 31 can be detached from the FIMS system 1.

Figure 7:
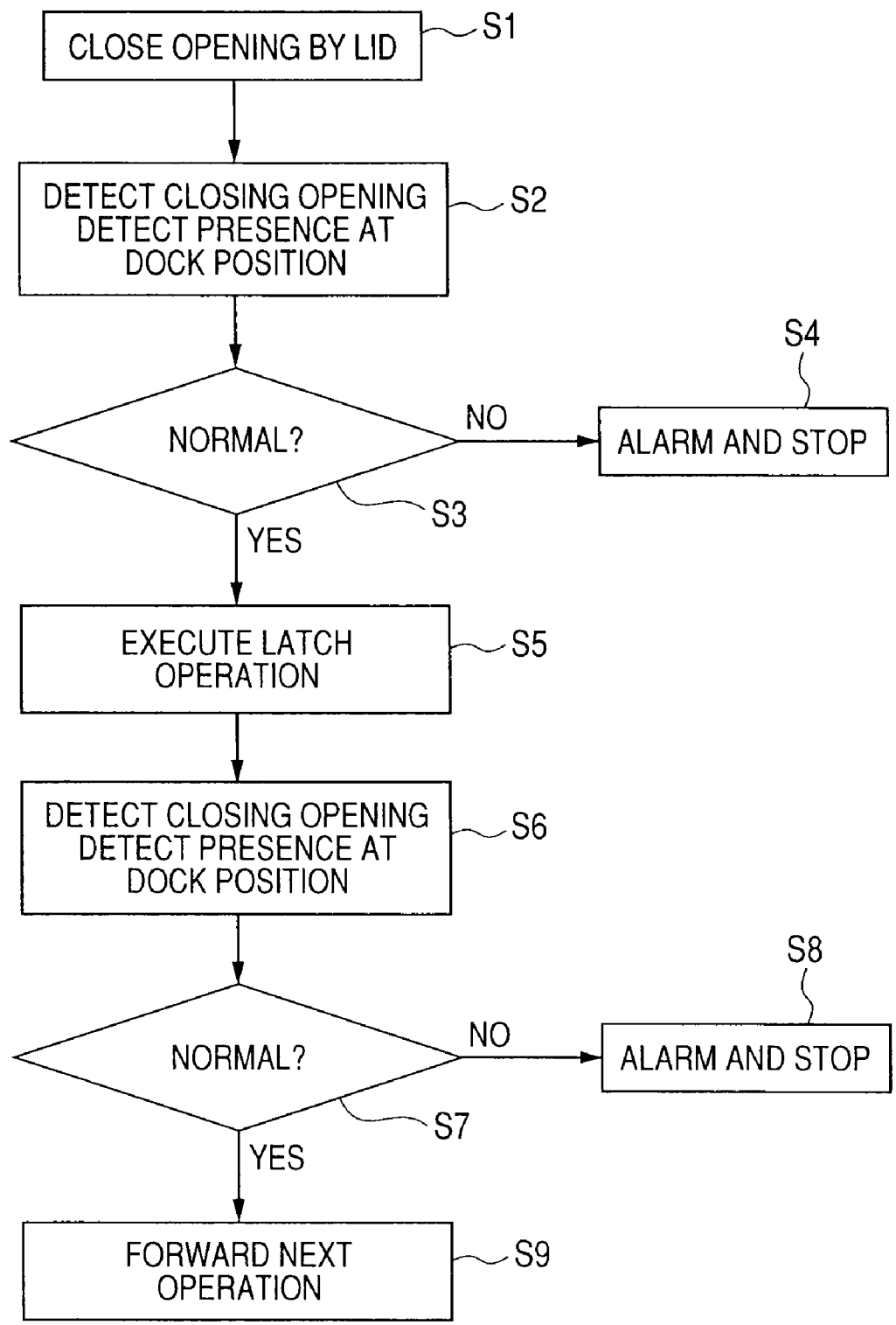
FIG. 7 is a flow chart illustrating a lid closing method for a pod as a closed container according to the embodiment of the present invention.

Regarding the FIMS system 1 having the above-mentioned structure, the features of the present invention are described in detail. Typically, when the pod 31 is unloaded (or brought into a state in which the pod 31 can be removed) from the FIMS system 1, each component is operated by reversing the procedure of loading (placing the pod on the support table) as described above. FIG. 7 is a flow chart illustrating operations performed by the control device 2 in the unloading operation according to this embodiment. Specifically, the door system 15 operates to attach the lid 33 to the opening 31a of the pod 31 that is kept stationary at the dock position (Step S1). The door-position detecting sensor including the above-mentioned photo sensor 6 transmits the sequence of OFF-ON-OFF signals to the control device 2 at the predetermined timing in the operation of attaching the lid 33. Further, the dock sensor 27c transmits, to the control device 2, the signal indicating whether or not the forward end of the docking plate is present at its reference position (Step S2). Then, the control device 2 compares the signals output from the photo sensor and the dock sensor with the normal signals (Step S3). When the result that the position of the door is inappropriate or the forward end of the docking plate is displaced from the reference position is obtained, the control device 2 outputs the information indicating the abnormality to stop the apparatus (Step S4).

When the control device 2 determines by the signals output from all sensors that there is no problem, the operation of the latch system 15e is performed and the lid 33 is fixedly attached to the pod 31 (Step S5). Typically, even if this fixation operation is performed, the position of the door and the position of the docking plate do not change. However, there is a fear in that both the door-position detecting sensor and the dock sensor 27c can not detect apparent abnormality due to, for example, slight deformation of the door. In such a case, the lid 33 may return to the normal position by an operation of projecting the engagement tongue by the latch system 15e, or the engagement tongue may not be received in the receiving hole and the stop position of the door or the docking plate is shifted at this stage. Therefore, in this embodiment, the control device 2 determines again the signals output from the door-position detecting sensor and the dock sensor 27c at this stage (Steps S6 and S7). At this time, when the result that the position of the door is inappropriate or the forward end of the docking plate is displaced from the reference position is obtained, the control device 2 outputs the information indicating the abnormality to stop the apparatus (Step S8). When the control device 2 determines by the signals output from all sensors that there is no problem, the holding of the lid 33 by the door 15a is released (Step S9), and the docking plate drive system 27 moves the pod 31 to the unload position. By performing the above-mentioned operations by the control device 2, it is possible to fixedly attach the lid 33 to the pod 31 precisely and reliably. Note that, in the above-mentioned embodiment, the engagement tongue is not received in the receiving hole and the positions of the door and the docking plate may be present at the predetermined positions owing to minute deformation of the lid itself. In this case, a configuration in which a signal for determining whether the operation of the latch system 15e is appropriate or not is added to the above-mentioned operations, and this signal is determined. As a result, it is possible to determine the state of the lid 33 more reliably.

By carrying out the above-mentioned lid closing method for a pod according to the present invention, it is possible to detect easily and reliably whether or not the lid is fixedly attached to the pod appropriately. Advantageously, the present invention can be implemented only by arranging the door-position detecting sensor to a conventional apparatus and by adding, to the operation flow in the conventional apparatus, a step of determining whether the signals from the door-position detecting sensor and the dock sensor indicate ON or OFF and a step of performing fixation operation of the lid again according to the results of determination. Further, it is unnecessary to particularly add a new structure to the pod, and it is possible to implement the present invention by using a conventional pod as it is.

Note that, in the above-mentioned embodiment, the dock sensor 27c is used as a displacement detecting means for detecting displacement of the docking plate 23, etc. However, in a case, for example, where the pod has such a shape that the opening side projects, appropriate detection of displacement by the dock sensor 27c may be impossible due to its position. In this case, not only a signal from the dock sensor may be used, but also a signal from what is called an undock sensor (not shown) that is provided so as to detect a certain amount of displacement of the docking plate from the dock position may be used in combination with the signal from the dock sensor. By using two position signals from the dock sensor and the undock sensor, the fixation state of the lid can be determined based on displacement of the pod in a specific zone according to the type of the pod to be used. Therefore, it is possible to detect the fixation state of the lid on the pod irrespective of the shape of the pod.

Further, the movement involving release of load applied to the drive cylinder 27b is suppressed as much as possible by detecting minute displacement, and thus so-called loss time involving this movement may be reduced. In addition, depending on the type of the pod, the lid 33 may be fixedly attached to the pod 31 through the intermediation of an elastic member. In this case, when the docking plate 23 or the like does not undergo displacement of an amount equal to or larger than a deformation amount of the elastic member in the actual operation, it may be impossible to determine whether or not the fixation state of the lid 33 is appropriate. In those cases, it is preferred that, instead of the drive cylinder 27b, a so-called servomotor be used as a drive source. Though it is necessary to modify the structure of the apparatus due to addition of the above-mentioned structure, it is possible to further reduce the displacement required for detection by detecting the displacement of the docking plate, etc. with use of an encoder added to the servomotor. Further, a servomotor capable of controlling torque may be used. With use of this servomotor, a change in torque when the docking plate temporarily moves may be obtained in advance, and the fixation state of the lid may be detected by comparing a difference between the change in torque and the actually-obtained torque. That is, a memory and a comparative circuit are provided in a control unit. Normal fluctuation in torque is stored in the memory, and the comparative circuit compares the fluctuation in the actually-obtained torque with the fluctuation in torque stored in the memory, and determines that the lid is not fixedly attached appropriately when a different point exceeds a threshold value as the result of the comparison. The above-mentioned operations are performed in the Step S3 or S7. In this case, even when no displacement exists practically, it is possible to detect the fixation state of the lid. Note that, in the present invention, such a change in torque is also defined as the displacement of the pod. The above-mentioned dock sensor, the undock sensor, the encoder, a detection mechanism for detecting the change in torque, and a member such as a timer additionally provided thereto are collectively defined as the displacement detecting means. With use of the displacement detecting means as described above, it is possible to detect whether or not the fixation state of the lid is appropriate irrespective of the shape of the pod. Note that, as the displacement detecting means, there may be adopted a member such as a photoelectric sensor for detecting the actual displacement of the pod. That is, the displacement detecting means according to the present invention can be replaced by various structures capable of detecting the minute displacement of the docking plate or the pod, or detecting the change in load torque applied to one or both of the docking plate and the pod.

Note that, in the above-mentioned embodiment, as a fixation means for fixedly attaching the lid to the pod, the structure including the engagement tongue provided on the lid and the receiving hole formed in the pod is exemplified. However, the fixation means for fixedly attaching the lid integrally with the pod according to the present invention is not limited to the fixation means according to this embodiment. The engagement tongue and the receiving hole may be provided so as to interchange their positions with each other. In addition, there may be used various fixation means which are different from the above-mentioned fixation means and capable of performing fixation and release by an operation from outside the fixation means. Further, though the suction pads are used as a lid holding means, the lid holding means is not limited to the suction pads, and other various means such as a holding means using a so-called latch may be used. Note that, when another lid holding means is used, it is required that the docking plate driving means and the lid holding means be designed in such a way that the driving force supplied from the drive cylinder is weaker than the lid holding force of the lid holding means in the process of determining the fixation state of the lid.

Figure 9A:
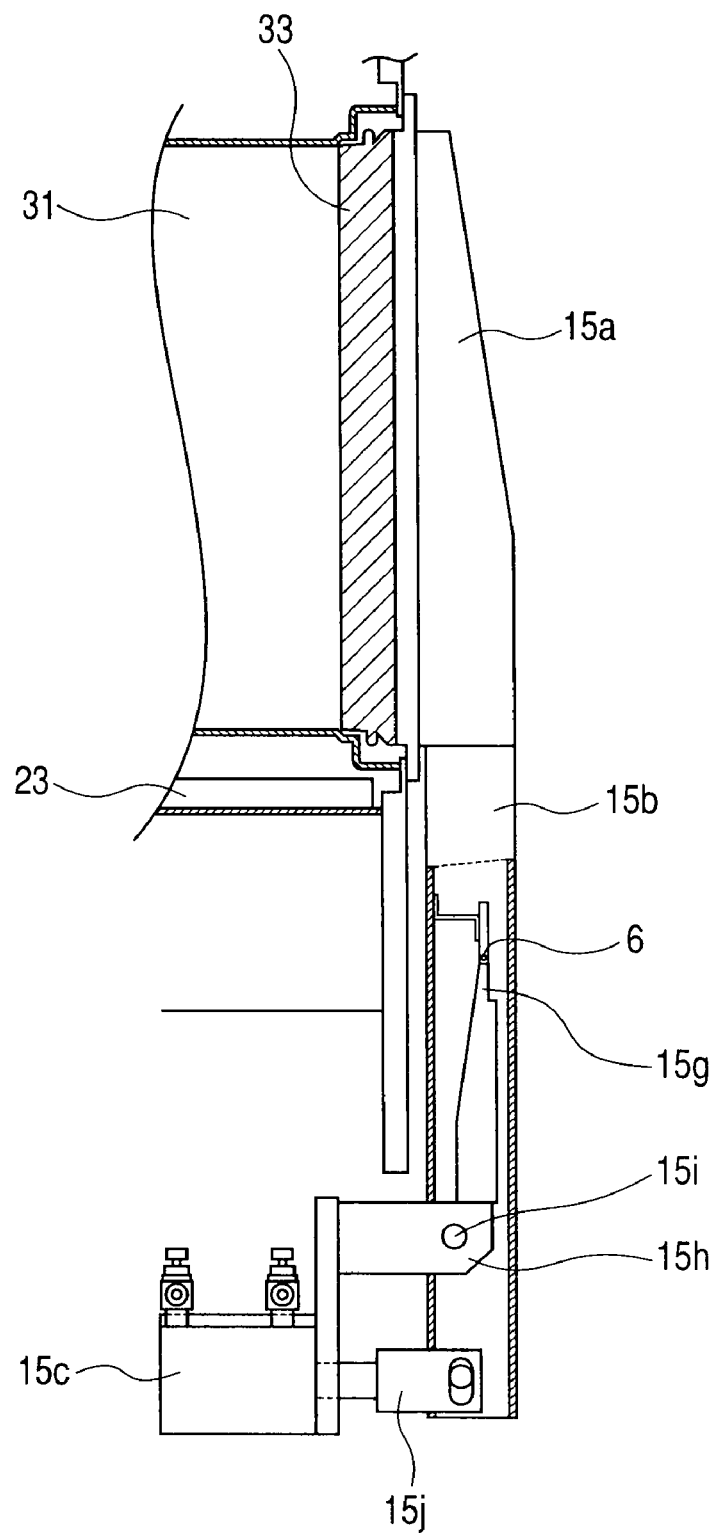
FIG. 9A shows a variation embodiment of a structure shown in FIG. 4A, showing a view illustrating, while focusing on a door-position detecting sensor, a state in which a lid 33 is normally attached to a pod 31.
Figure 9B:
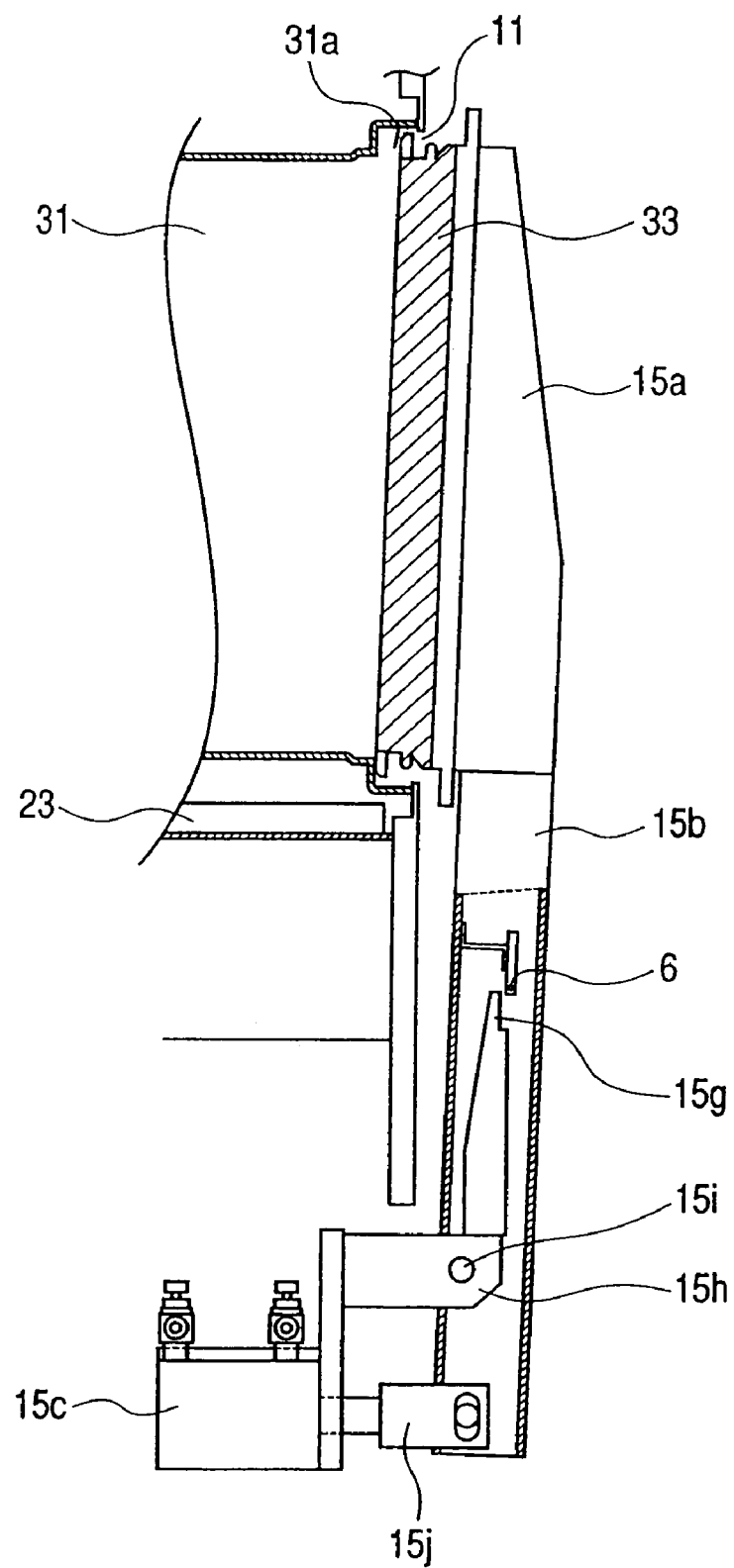
FIG. 9B is a view illustrating, in a manner similar to FIG. 9A, a state in which the lid 33 is not normally attached to the pod 31.

As shown in FIGS. 4A and 4B, the above mentioned embodiment describes the structure in which the photo sensor 6 is fixed to the chassis and the door sensor dog 15g is movable together with the door arm 15b. Conversely, a variation in which the photo sensor 6 is movable together with the door arm 15b can be employed. In the following, such variation is described with reference to FIGS. 9A and 9B. FIGS. 9A and 9B are variations of the structure shown in FIGS. 4A and 4B, respectively. The door arm 15b is pivotably supported by a supporting member 15h so as to be swingable (rotatable) about a shaft 15i corresponding to the rotation center. The supporting member 15h is fixed to the door open/close actuator 15c, penetrates a wall portion of the door arm 15b toward inside of the door arm 15b from the door open/close actuator 15c and projects horizontally. The supporting member 15h moves upward or downward together with the door open/close actuator 15c. A rod 15j extending projectably from the door open/close actuator 15c is coupled to an end of the door arm 15b which is arranged at the opposite side of the door 15a, in which the shaft 15i is positioned between the door 15a and the end of the door arm 15b. When the rod 15j projects, the door arm 15b is swung about the shaft 15i corresponding to the rotation center so as to close the door 15a, whereas, when the rod 15j is retracted, the door arm 15b is swung about the shaft 15i corresponding to the rotation center so as to open the door 15a. The photo sensor 6 is mounted on an inner wall portion of the door arm 15b via an attaching member. That is, the photo sensor 6 includes a light receiving portion and a light emitting portion, and the photo sensor 6 is fixed to the door arm 15b such that light emitted from the light emitting portion of the photo sensor 6 impinges on the light receiving portion. By this structure, the photo sensor 6 is movable in conjunction with the swing movement of the door arm 15b. That is, when the door 15a opens or closes, the photo sensor 6 is swung in conjunction with the swing of the door arm 15b supporting the door 15a about the rotation center. Further, in this embodiment, the door sensor dog 15g is fixed to the supporting member 15h pivotably supporting the door arm 15b. For example, the door sensor dog 15g is integrally coupled to the supporting member 15h from the door open/close actuator 15c inside the door arm 15b so as to project upwardly toward the photo sensor 6.

In this embodiment, the structure including the photo sensor 6 and the door sensor dog 15g is used as the door position detecting sensor. The door sensor dog 15g is fixed to the door open/close actuator 15c so as to satisfy following three states. First, in a first state where the pod 31 is not closed by the lid 33 held by the door 15a, light impinging on the light receiving portion of the photo sensor 6 is not blocked by the door sensor dog 15g so that the photo sensor 6 generates the OFF signal and transmits it to the control device 2. Next, as shown in FIG. 9A, in a normal operation of attaching the lid 33 to the pod 31, the photo sensor 6 moves in conjunction with the swing of the door arm 15b. In a second state where the pod 31 is closed by the lid 33 in a predetermined state, light impinging on the light receiving portion of the photo sensor 6 is blocked by the door sensor dog 15g so that the photo sensor transmits the ON signal to the control device 2. The predetermined state indicates such state that the opening 31a of the pod 31 is closed by the lid 33 with a correct posture, for example. In contrast, as illustrated in FIG. 9B, the lid 33 may be sometimes pushed into the receiving recess of the pod 31 while being inclined due to a failure to fixedly attach the pod 31 or to hold the lid 33 by the door 15a, abnormality of operation of the door 15a, etc. In this case, the opening 31a of the pod 31 is not closed by the lid 33 with a correct posture, even when the latch system 15e is operated in this state, the engagement tongue does not appropriately engage with the receiving hole, with the result that the lid 33 may fall down at the time of transportation of the pod. As mentioned above, in a third state where the pod 31 is closed by the lid 33 in a state other than the predetermined state, light impinging on the light receiving portion of the photo sensor 6 is not blocked by the door sensor dog 15g so that the photo sensor maintains the transmission of the OFF signal to the control device 2. In the above description, a signal outputted when the pod 31 is closed by the lid 33 in the predetermined state is called the ON signal. In a state other than the predetermined state, the pod 31 is not closed by the lid 33 or the pod 31 is closed by the lid 33 in an abnormal state. A signal outputted in such state is called the OFF signal. Therefore, light impinging on the light receiving portion of the photo sensor 6 is blocked by the door sensor dog 15g only when the opening 31a is closed by the lid 33 in the predetermined state. That is, the photo sensor 6 can switch the outputted signal in accordance with whether or not light impinging on the light receiving portion of the photo sensor 6 is blocked by the door sensor dog 15g. After such operation that the opening 31a of the pod 31 is closed by the lid 33 is performed, a state of the signal outputted from the photo sensor 6 (the ON signal or the OFF signal) is determined by the control device 2. That is, the presence of the door 15a at the position at which the door 15a closes the opening portion is determined by the control device 2. Further, the latch system 15e is operated only when the ON signal is outputted. On the other hand, the latch system 15e is not operated when the OFF signal is outputted. That is, only when the opening 31a of the pod 31 is correctly closed by the lid 33, the latch system 15e is operated so that a possibility of a correct engagement of the engagement tongue with the receiving hole increases. As described above, in this embodiment, after the fixing operation of the lid 33 to the pod 31 by operating the latch system 15e, whether or not the photo sensor 6 maintains the output of the ON signal is determined by the control device 2 again (Steps S6 and S7 in FIG. 7). That is, it is determined by the control device 2 that the door 15a is not displaced and the door 15a is positioned at the position at which the door 15a closes the opening portion 11, even when the latch system 15e is operated. This determination is performed in order to confirm whether such problem that the engagement tongue of the lid 33 does not correctly engage with the receiving hole of the pod 31 though the latch system 15e has been normally operated does not happen. When the pod 31 is not closed by the lid 33 or the pod 31 is closed by the lid 33 in an abnormal state, the latch system 15e is not operated and a treatment required to close correctly the opening 31a of the pod 31 by the lid 33 can be performed. Thus, even with such a simple structure including the photo sensor and the sensor dog, it is possible to detect the attaching state of the lid 33 to the pod 31 by switching a signal outputted from the photo sensor 6 and monitoring the change of the signal in accordance with whether or not light impinging on the light receiving portion of the photo sensor 6 is blocked by the door sensor dog 15g.

Further, it is possible to employ such structure that one of the light emitting portion and the light receiving portion of the photo sensor 6 is fixed to the door arm 15b, becomes movable in conjunction with the swing of the door arm 15b and the other is fixed to the supporting member 15h pivotably supporting the door arm 15b at the shaft 15i corresponding to the rotation center as the door sensor dog 15g. In this structure, only when the opening 31a of the pod 31 is closed by the lid 33 in the predetermined state, light emitted from the light emitting portion impinges on the light receiving portion and the photo sensor 6 outputs the ON signal so that the latch system 15e can be operated. In this structure, the door sensor dog 15g is not required.

Figure 8:
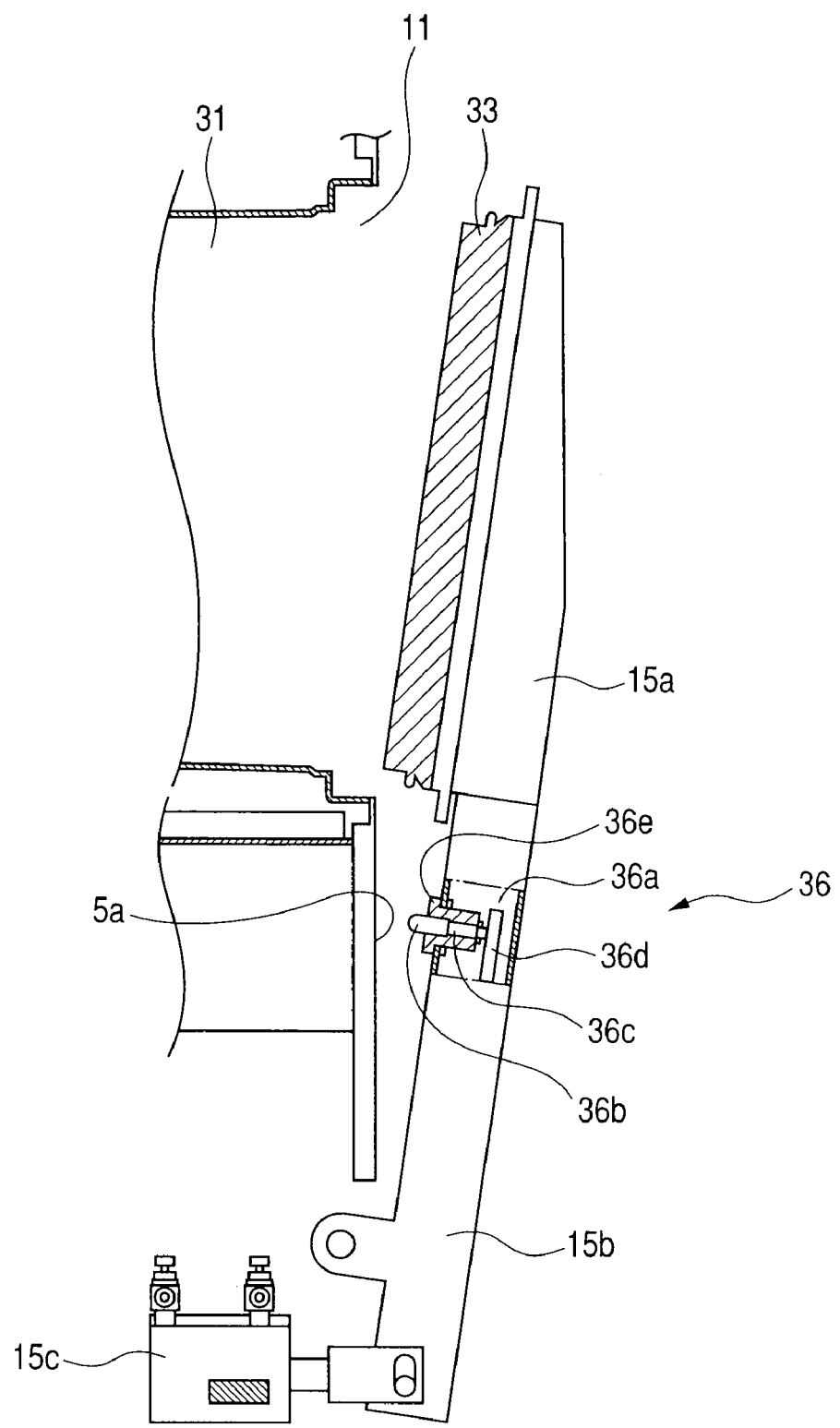
FIG. 8 is an enlarged schematic view illustrating, in a manner similar to FIG. 4A, etc., the components provided in the vicinities of the door and the first opening portion in the load port apparatus illustrated in FIG. 1.

Further, in the above-mentioned embodiment, the structure is illustrated in which the door-position detecting sensor is arranged in the divided form on the door arm 15b and a chassis wall 5a of the chassis 5 defining the mini-environment, the chassis wall 5a having the opening portion 11 formed therein. However, the door-position detecting sensor may be arranged on one of the door arm 15b and the chassis wall 5a. FIG. 8 illustrates a mode according to this embodiment in which the door-position detecting sensor is arranged on the door arm. FIG. 8 illustrates, in a manner similar to FIG. 4A, etc., a state in which the door 15a does not close the first opening portion 11 yet. In this mode, on the front surface of the door arm 15b opposed to the chassis wall 5a having the first opening portion 11 formed therein, a movable sensor 36 of a so-called plunger type is arranged. The movable sensor 36 includes a door recessed portion 36a formed in the front surface of the above-mentioned door arm 15b, a movable dog 36b, a biasing means 36c including an elastic member such as a spring, a movable dog detecting sensor 36d, and a dog-position regulating means 36e. The movable dog 36b extends in a direction perpendicular to the front surface of the door arm 15b, and includes a pin-like member provided in the direction perpendicular thereto. The biasing means 36c is received in the interior of the door recessed portion 36a. One end of the biasing means 36c is brought into contact with the inner wall of the door recessed portion 36a, whereas the other end thereof is brought into contact with the movable dog 36b. The dog-position regulating means 36e is provided with a through hole that allows the tip end of the movable dog 36b to pass therethrough. Further, by closing the opening portion of the door recessed portion 36a and being brought into contact with a part thereof in accordance with axial movement of the movable dog 36b, the dog-position regulating means 36e regulates the projecting amount of the movable dog 36b from the front surface of the door arm 15b. The above-mentioned biasing means 36c imparts a biasing force to the movable dog 36b in the chassis wall 5a direction, and thus a part of the movable dog 36b is brought into contact with the dog-position regulating means 36e to maintain a state of projecting by a predetermined amount. When the door 15a reaches a position of nearly closing the first opening portion 11, the tip end (end opposed to the chassis wall 5a) of the movable dog 36b is brought into contact with the corresponding chassis wall 5a, and the movable dog 36b is pushed into the door recessed portion 36a while reducing the projecting amount thereof. On the bottom of the door recessed portion 36a, the movable dog detecting sensor 36d constituted by, for example, a contact sensor or a photo sensor is arranged. Therefore, according to the presence of the rear end of the movable dog 36b pushed into the door recessed portion 36a or the moving amount of the movable dog 36b, the movable dog detecting sensor 36d outputs a signal corresponding the position of the door 15a. With this structure, the structure relating to the door-position detecting sensor is provided only to the door system 15, and hence application to the existing FIMS system can be easily realized.

Note that, in the mode illustrated in FIG. 4A, etc. or FIG. 8, it is preferred that the door-position detecting sensor be arranged not on a side of the rotation center for rotating movement in the door arm 15b but on a region in the door arm 15b adjacent to its bonded portion with the door 15a. More specifically, it is preferred that the door-position detecting sensor be arranged in a region which is adjacent to the door 15a and opposed to a region on the mini-environment 3 side of the chassis wall 5a, or, in a region on the mini-environment 3 side corresponding to a region on the exterior space side of the chassis wall 5a in which the docking plate drive system 27 is provided. The region is a space in which the rotating movement and the up/down movement of the door 15a are not obstructed, and allows a sensor, a recessed space, etc. to be easily provided therein. In comparison with the conventional structure, the region may be least affected in view of keeping cleanliness of the FIMS system. Further, the door-position detecting sensor can be arranged in a region in which the movement of the door 15a for closing the first opening portion 11 is not obstructed, that is, a region which is farthest away from the rotation center of the door arm 15b and allows the door-position detecting sensor to be placed therein, and hence the displacement of the door 15a is enlargingly detected. Therefore, it is possible to detect a posture of the door or the change in the posture of the door with high accuracy.

The above description of the embodiment has been directed mainly to an FIMS system for wafers. However, the applications of the invention are not limited to that system, and the present invention can also be applied to closed containers for storing display panels, optical disks, or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A lid closing method used for closing a closed container comprising a container body having an opening on one lateral side thereof, a lid for closing the opening, and an engagement means for fixedly attaching the lid to the opening of the container body by an operation from outside one of the lid and the closed container, by using a lid opening/closing system that comprises:

a mini-environment having an opening portion;

a door that is movable between a position at which the door nearly closes the opening portion and a position at which the door leaves the opening portion open, and comprises a lid holding means for holding the lid;

a docking plate on which the closed container is allowed to be placed in such a way that the opening is opposed to the opening portion, the docking plate being movable toward and away from the opening portion together with the closed container to arrange, when located at a position close to the opening portion, the closed container at a first position at which the lid is to be detached, and to arrange, when located at a position away from the opening portion, the closed container at a second position at which loading and unloading of the closed container is to be performed; and a docking plate driving means for causing the docking plate to move toward and away from the opening portion, the lid closing method comprising the steps of:

moving the lid to the position at which the door nearly closes the opening portion;

determining, before the operation from outside is performed, presence of the door at the position at which the door nearly closes the opening portion and presence of the docking plate at the first position;

fixedly attaching the lid to the closed container by the engagement means; and after the operation from outside is performed, again determining the presence of the door at the position at which the door nearly closes the opening portion and the presence of the docking plate at the first position.

2. A lid closing method according to claim 1, wherein:

the docking plate driving means comprises a cylinder mechanism; and a drive force for driving the docking plate by the docking plate driving means is set smaller than a drive force exerted when the door is moved to nearly close the opening portion.

3. A lid closing method according to claim 1, wherein:

the door is swingably supported by a door arm for supporting the door at one end thereof, a door open/close actuator coupled to another end of the door arm to drive the door arm, and a rotation center for rotatably and pivotally supporting the door arm between the door and the door open/close actuator; and the step of determining a presence of the door at the position at which the door nearly closes the opening portion, is made based on a signal that is obtained from a door-position detecting sensor provided between the rotation center in the door arm and the door.

4. A lid closing method according to claim 3, wherein the door-position detecting sensor comprises:

a door sensor dog that projects from the door arm; and a photo sensor which is provided on a surface of a chassis having the opening portion formed therein, and is arranged in a sensor recessed space constituting a recessed portion that allows entrance of the door sensor dog thereinto, the chassis defining the mini-environment, the photo sensor outputting a signal while the signal is switched according to the entrance of the door sensor dog into the sensor recessed space.

5. A lid closing method according to claim 3, wherein the door-position detecting sensor comprises:

a photo sensor which is fixed to the door arm and movable in conjunction with a swing of the door arm; and a door sensor dog which is fixed to a supporting member pivotably supporting the door arm, wherein the photo sensor moves in conjunction with a swing of the door arm, wherein the door sensor dog blocks light impinging on a light receiving portion of the photo sensor only when the opening is closed by the lid in a predetermined state, and wherein the photo sensor switches an outputted signal in accordance with whether or not the door sensor dog blocks light impinging on the light receiving portion of the photo sensor.

6. A lid closing method according to claim 3, wherein the door-position detecting sensor comprises:

a door recessed portion formed in a front surface of the door arm that is opposed to a surface of a chassis having the opening portion formed therein, the chassis defining the mini-environment;

a movable dog that is received in the door recessed portion and has a tip end projecting from the front surface of the door arm;

a biasing means received in the door recessed portion, for imparting a biasing force in a projecting direction to the movable dog; and a movable-dog-position detecting sensor for outputting a signal corresponding to a projecting amount of the movable dog from the front surface of the door arm according to a position at which the movable dog stops.

7. A lid opening/closing system that opens and closes a lid of a closed container to allow transfer of an object to be stored into/out of an interior of the closed container, the closed container comprising the lid, having an opening to be closed by the lid on one lateral side thereof, and being capable of storing therein the object to be stored, the lid and the closed container comprising an engagement means for fixedly attaching the lid to the closed container by an operation from outside one of the lid and the closed container, the lid opening/closing system comprising:

a mini-environment having an opening portion;

a door that is movable between a position at which the door nearly closes the opening portion and a position at which the door leaves the opening portion open, and comprises a lid holding means for holding the lid;

a docking plate on which the closed container is allowed to be placed in such a way that the opening is opposed to the opening portion, the docking plate being movable toward and away from the opening portion together with the closed container to arrange, when located at a position close to the opening portion, the closed container at a position at which the lid is to be detached and the object to be stored is transferred into/out of the closed container, and to arrange, when located at a position away from the opening portion, the closed container at a position at which loading and unloading of the closed container is to be performed;

a docking plate driving means for causing the docking plate to move toward and away from the opening portion;

a displacement detecting means for detecting that the docking plate is displaced from the position close to the opening portion; and a door-position detecting sensor for outputting a signal according to presence of the door at the position at which the door nearly closes the opening portion.

8. A lid opening/closing system according to claim 7, wherein:

the docking plate driving means comprises a cylinder mechanism; and a drive force for driving the docking plate by the docking plate driving means is set smaller than a drive force exerted when the door is moved to nearly close the opening portion.

* * * * *